United States Patent
Lee et al.

(10) Patent No.: US 8,637,894 B2
(45) Date of Patent: Jan. 28, 2014

(54) ORGANIC LIGHT-EMITTING DISPLAY APPARATUS THAT PREVENTS A THICK ORGANIC INSULATING LAYER FROM LIFTING

(75) Inventors: Yul-Kyu Lee, Yongin (KR); Chun-Gi You, Yongin (KR); Sun Park, Yongin (KR); Jong-Hyun Park, Yongin (KR); Kwang-Hae Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 106 days.

(21) Appl. No.: 13/099,928

(22) Filed: May 3, 2011

(65) Prior Publication Data

US 2012/0139000 A1    Jun. 7, 2012

(30) Foreign Application Priority Data

Dec. 2, 2010 (KR) ................. 10-2010-0122091

(51) Int. Cl.
*H01L 27/32* (2006.01)
*H01L 51/56* (2006.01)

(52) U.S. Cl.
USPC .......... 257/99; 257/48; 257/59; 257/E27.119; 257/E33; 257/E51.018; 438/23; 438/18; 438/30

(58) Field of Classification Search
USPC .......... 257/99, 40, 48, 59, 72, E23, E33, E21, 257/E27, 119, E51.018; 438/23, 18, 30
See application file for complete search history.

(56) References Cited

U.S. PATENT DOCUMENTS

| | | | |
|---|---|---|---|
| 6,714,268 B2 * | 3/2004 | Wang et al. | 349/48 |
| 7,088,408 B2 * | 8/2006 | Ozawa et al. | 349/114 |
| 7,230,668 B2 * | 6/2007 | Lee et al. | 349/152 |
| 2004/0251827 A1 | 12/2004 | Kang et al. | |
| 2005/0052126 A1 | 3/2005 | Kim | |
| 2008/0017855 A1 * | 1/2008 | Kim et al. | 257/48 |
| 2009/0200937 A1 * | 8/2009 | Sagawa et al. | 313/505 |
| 2010/0090594 A1 | 4/2010 | Choi et al. | |

FOREIGN PATENT DOCUMENTS

| | | |
|---|---|---|
| KR | 10-2004-0106058 | 12/2004 |
| KR | 10-2005-0025786 | 3/2005 |
| KR | 10-0804539 | 2/2008 |
| KR | 10-2010-0041123 | 4/2010 |

* cited by examiner

*Primary Examiner* — William F Kraig
*Assistant Examiner* — Sheng Zhu
(74) *Attorney, Agent, or Firm* — Robert E. Bushnell, Esq.

(57) ABSTRACT

In an organic light-emitting display apparatus and a method of manufacturing the same, a pad region of the organic light-emitting display apparatus comprises a protrusion layer including a plurality of protrusion portions formed on a substrate so as to protrude, a pad lower electrode and a pad upper electrode, the pad lower electrode including a protrusion portion formed along a protrusion outline of the protrusion layer and a flat portion formed along the substrate, and the pad upper electrode being formed on the flat portion of the pad lower electrode. A source/drain electrode layer is formed on the pad upper electrode, an organic layer is formed on the source/drain electrode layer, and a counter electrode layer is formed on the protrusion portion of the pad lower electrode and the organic layer. The counter electrode layer follows the protrusion outline of the protrusion layer on the protrusion portion. According to such a structure, cost is reduced due to a reduction in the number of masks, the manufacturing process is simplified, and a lifting phenomenon of the organic layer in the pad region is solved.

20 Claims, 13 Drawing Sheets

ORGANIC LIGHT-EMITTING DISPLAY APPARATUS THAT PREVENTS A THICK ORGANIC INSULATING LAYER FROM LIFTING

CLAIM OF PRIORITY

This application makes reference to, incorporates the same herein, and claims all benefits accruing under 35 U.S.C. §119 from an application earlier filed in the Korean Intellectual Property Office on 2 Dec. 2010 and there duly assigned Serial No. 10-2010-0122091.

BACKGROUND OF THE INVENTION

1. Field of the Invention

The present invention relates to an organic light-emitting display apparatus and a method of manufacturing the same, and more particularly, to an organic light-emitting display apparatus and a method of manufacturing the same by which the number of mask uses can be reduced during manufacturing of the organic light-emitting display apparatus and a defect in coating an organic layer in a pad region can be corrected.

2. Description of the Related Art

An organic light-emitting display apparatus is manufactured on a substrate on which a pattern including a thin-film transistor (TFT), a capacitor, and wiring connecting the TFT and the capacitor is formed.

Generally, a fine structure pattern including a TFT and so forth is transferred to an array substrate by using a mask on which the fine structure pattern is printed so that the substrate on which the organic light-emitting display apparatus is manufactured can be patterned.

Pattern transfer using a mask is generally performed using a photolithography method. According to the photolithography method, photoresist is evenly applied on a substrate on which a pattern is to be formed. The photoresist is exposed to light by using photolithography equipment, such as a stepper, and the light-sensitive photoresist is developed (in the case of positive photoresist). Furthermore, after the photoresist is developed, the remaining photoresist is used as a mask for etching a pattern, and the remaining photoresist is then removed.

In the process of transferring a pattern by using the mask, as described above, it is necessary to prepare the mask having a required pattern, and thus the cost of fabricating the mask increases as more operations are performed using the mask. Therefore, to solve this problem, a structure capable of reducing the number of mask uses is needed.

As an approach to reduce the number of mask uses, a scheme for forming an organic layer, which functions as a pixel defining layer, with a large thickness of 3 µm or more to avoid a need to form a separate spacer has been considered. In this scheme, however, stress on the thick organic layer increases so that coating is not performed appropriately, especially in a pad region which is an end portion of the organic layer, resulting in a lifting phenomenon. Therefore, there is a need for a scheme capable of reducing the number of mask uses and avoiding a problem caused by an organic layer coating defect.

SUMMARY OF THE INVENTION

The present invention provides an organic light-emitting display apparatus and a method of manufacturing the same by which the number of processes of patterning using a mask can be reduced and an organic layer coating defect problem in a pad region can be solved.

According to an aspect of the present invention, an organic light-emitting display apparatus comprises: a light-emitting region including an organic light-emitting element, a thin-film transistor (TFT), and a capacitor; and a non-light-emitting region including a pad region connected with wiring of the light-emitting region. The pad region comprises: a protrusion layer including a plurality of protrusion portions formed on a substrate to protrude; a pad electrode including a pad lower electrode and a pad upper electrode, the pad lower electrode comprising a protrusion portion formed along a protrusion outline of the protrusion layer and a flat portion formed along the substrate, and the pad upper electrode being formed on the flat portion of the pad lower electrode; a source/drain electrode layer formed on the pad upper electrode; an organic layer formed on the source/drain electrode layer; and a counter electrode layer formed on the protrusion portion of the pad lower electrode and the organic layer, the counter electrode layer following the protruding outline of the protrusion layer on the protrusion portion.

A buffer layer may be formed between the substrate and the protrusion layer.

A gate insulating layer may be formed between the protrusion layer and the pad lower electrode, and an interlayer insulating layer is formed between the pad upper electrode and the source/drain electrode layer.

The organic layer may be formed so as to cover both the source/drain electrode layer and the pad upper electrode.

The organic layer may be formed so as to expose the source/drain electrode layer and the pad upper electrode, and the counter electrode layer may be formed so as to contact the exposed portions of the source/drain electrode layer and the pad upper electrode.

The TFT may include an active layer formed on the same layer as the protrusion layer, a gate electrode formed on the same layer as the pad electrode, and source/drain electrodes formed of the same layer as the source/drain electrode layer.

The organic light-emitting element may include a pixel electrode formed on the same layer as the pad electrode, a counter electrode formed of the same layer as the counter electrode layer, and a light-emitting layer interposed between the pixel electrode and the counter electrode.

The capacitor may include a capacitor lower electrode formed on the same layer as the protrusion layer, a capacitor upper electrode formed on the same layer as the pad electrode, and a gate insulating layer interposed between the capacitor lower electrode and the capacitor upper electrode.

According to another aspect of the present invention, a method of manufacturing an organic light-emitting display apparatus comprises: forming an active layer of a thin-film transistor (TFT), a capacitor lower electrode of a capacitor, and a protrusion layer of a pad region on a substrate; forming a gate electrode of the TFT on the active layer, a pixel electrode of an organic light-emitting element on the substrate, a capacitor upper electrode of the capacitor on the capacitor lower electrode, and a pad electrode of the pad region on the protrusion layer; forming an interlayer insulating layer which comprises openings for exposing portions of the active layer, the pixel electrode, and the capacitor upper electrode, respectively, the interlayer insulating layer being also formed on the pad electrode of the pad region; forming source/drain electrodes contacting the exposed portions of the active layer and the pixel electrode, and a source/drain electrode layer disposed on the pad electrode and the interlayer insulating layer; forming an organic layer which exposes a portion of the pixel electrode and covers the source/drain electrodes of the TFT, the capacitor upper electrode of the capacitor, and the source/drain electrode layer of the pad region; forming a light-emitting layer contacting the exposed portion of the pixel electrode; and forming a counter electrode on the organic layer so as to face the pixel electrode with the light-emitting layer interposed between the counter electrode and the pixel electrode, and forming a counter electrode layer along a protrusion outline of the protrusion layer in the pad region.

The method may further include forming a buffer layer on the substrate.

The method may further include forming a gate insulating layer on the active to layer, the capacitor lower electrode, and the protrusion layer.

The pad electrode may include a pad lower electrode and a pad upper electrode, the pad lower electrode comprising a protrusion portion formed along a protrusion outline of the protrusion layer and a flat portion formed along the substrate, and the pad upper electrode being formed on the flat portion of the pad lower electrode.

The organic layer may be formed so as to cover both the source/drain electrode layer and the pad upper electrode.

The organic layer may be formed so as to expose portions of the source/drain electrode layer and the pad upper electrode, and the counter electrode layer may be formed so as to contact the exposed portions of the source/drain electrode layer and the pad upper electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
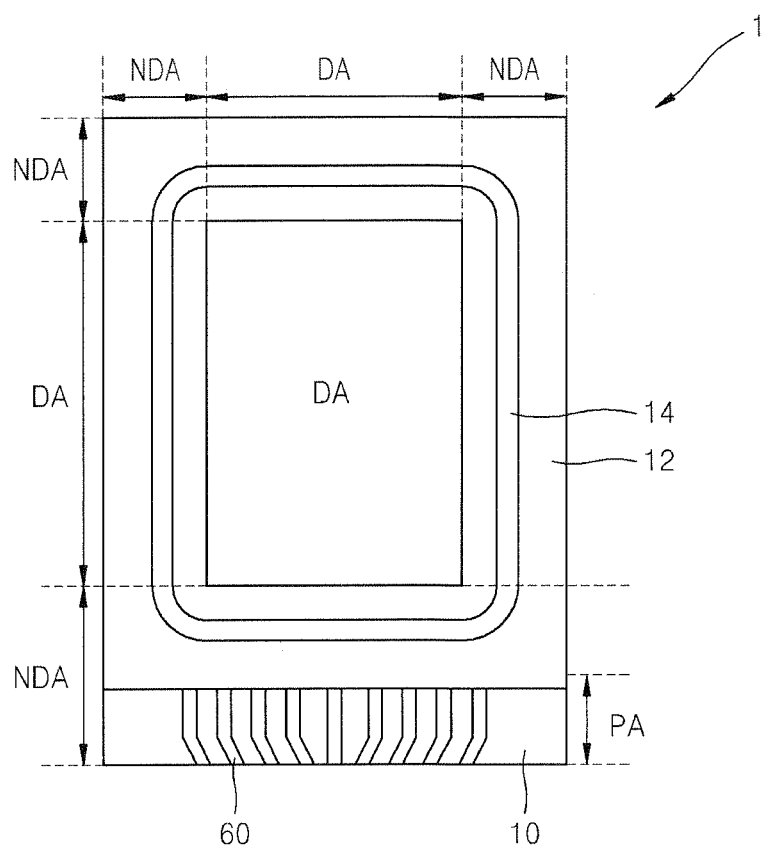
FIG. 1 is a plan view of an organic light-emitting display apparatus according to an exemplary embodiment of the present invention.

Hereinafter, an exemplary embodiment of the present invention will be described in detail with reference to the accompanying drawings.

Like reference numerals denote like elements throughout the specification. A detailed description of known functions and configurations will be omitted when it may unnecessarily obscure the subject matter of the present invention.

In the drawings for describing an embodiment of the present invention, the thicknesses of layers or regions are exaggerated for clarity. It will be understood that when an element such as a layer, film, region, or substrate is referred to as being "on" another element, it can be "directly on" the other element or intervening elements may also be present.

Figure 2:
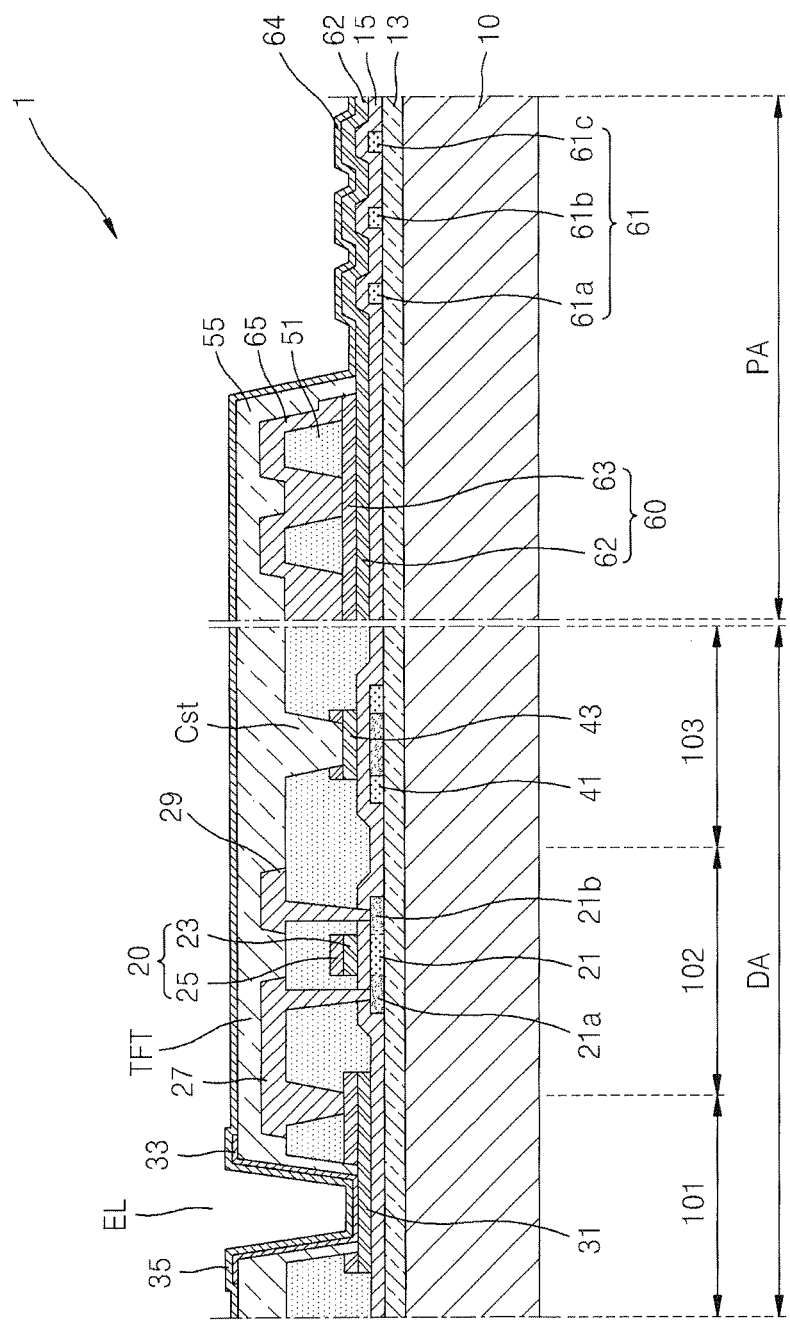
FIG. 2 is a cross-sectional view schematically showing a portion of the organic light emitting device shown in FIG. 1.

FIG. 1 is a plan view schematically showing a structure of an organic light-emitting display apparatus according to an exemplary embodiment of the present invention; and FIG. 2 is a cross-sectional view schematically showing a portion of the organic light emitting device shown in FIG. 1

The organic light-emitting display apparatus 1 includes a first substrate 10 which includes a thin-film transistor (TFT) and an organic light-emitting element EL, and a second substrate 12 bonded to the first substrate 10 by sealing.

The TFT, the organic light-emitting element EL, a capacitor Cst, and the like may be formed on the first substrate 10. The first substrate 10 may be a low-temperature polysilicon (LTPS) substrate, a glass substrate, a plastic substrate, a stainless steel (SUS) substrate, or the like.

The second substrate 12 may be an encapsulating substrate disposed on the first substrate 10 to protect the TFT and light-emitting pixels provided on the first substrate 10 from external moisture or air. The second substrate 12 is positioned facing the first substrate 10, and the first substrate 10 and the second substrate 12 are bonded to each other by a sealing member 14 disposed at a distance from an edge of the first substrate 10.

The first substrate 10 includes a light-emitting region DA from which light is emitted and a non-light-emitting region NDA surrounding the light-emitting region DA. According to an embodiment of the present invention, the sealing member 14 is disposed in the non-light-emitting region NDA located outside the light-emitting region DA so as to bond the first substrate 10 and the second substrate 12 to each other.

As stated above, in the light-emitting region DA of the first substrate 10, the organic light-emitting element EL, the TFT configured to drive the organic light-emitting element EL, and wiring electrically connected to the organic light-emitting element EL and the TFT are formed. The non-light-emitting region NDA may include a pad region PA where pad electrodes 60 extending from the wiring of the light-emitting region DA are located.

FIG. 2 schematically shows the light-emitting region DA and the pad region PA, which is included in the non-light-emitting region NDA, shown in FIG. 1.

Further referring to FIG. 2, the first substrate 10 of the organic light-emitting display apparatus 1 according to an embodiment of the present invention includes a pixel region 101, a channel region 102, a storage region 103 and the pad region PA, and a buffer layer 13 formed thereon.

The channel region 102 includes the TFT as a driving element. The TFT includes an active layer 21, a gate electrode 20, a source electrode 27, and a drain electrode 29. The gate electrode 20 includes a gate lower electrode 23 and a gate upper electrode 25. The gate lower electrode 23 is formed of a transparent conductive material. Between the gate electrode 20 and the active layer 21, a gate insulating layer 15 is formed for providing insulation therebetween. At both side end portions of the active layer 21, a source region 21a and a drain region 21b, which are doped with high-density impurities and which are connected to the source electrode 27 and the drain electrode 29, respectively, are formed.

The pixel region 101 includes the organic light-emitting element EL. The organic light-emitting element EL includes a pixel electrode 31, a counter electrode 35, and a light-emitting layer 33 interposed therebetween. The pixel electrode 31 is formed of a transparent conductive material, and is formed simultaneously with the gate electrode 20 of the TFT.

The storage region 103 includes the capacitor Cst. The capacitor Cst includes a capacitor lower electrode 41 and a capacitor upper electrode 43, between which the gate insulating layer 15 is interposed. The capacitor upper electrode 43 is formed simultaneously with the gate electrode 20 of the TFT and the pixel electrode 31 of the organic light-emitting element EL.

The pad region PA includes the pad electrode 60, which includes a pad lower electrode 62 and a pad upper electrode 63. The pad lower electrode 62 may be formed of the same material, and on the same layer, as the pixel electrode 31, the gate lower electrode 23, and the capacitor upper electrode 43. The pad upper electrode 63 may be formed of the same material, and on the same layer, as the gate upper electrode 25. Reference numeral 65 refers to a source/drain electrode layer formed of the same layer as the source electrode 27 and the drain electrode 29 of the TFT. Between the buffer layer 13 and the gate insulating layer 15 on the first substrate 10, a protrusion layer 61 wherein a plurality of protrusion portions 61a, 61b and 61c protrude, is formed. Thus, the pad region PA includes a protrusion portion where the protrusion layer 61 is present and a flat portion where the pad upper electrode 63 is present. Because the protrusion portion is formed in this way, a large contact area is provided when a counter electrode layer 64 is formed, thus allowing coating to be performed well and preventing an organic layer 55 under the counter electrode layer 64 from being lifted.

Reference numeral 51 refers to an interlayer insulating layer, and reference numeral 55 refers to the organic layer which functions as a pixel defining layer (PDL). Conventionally, the organic layer 55 is primarily formed, and then a spacer formed of the same material as the organic layer 55 is further formed on the organic layer 55 in the same manner. However, the formation of the separate spacer means that two photolithography processes are required for forming the organic layer, thereby increasing manufacturing cost and manufacturing time. To solve this problem, the organic layer 55 is formed so as to have a large thickness of 3 μm or more.

However, if the organic layer 55 is formed so as to have a large thickness, coating may not be performed appropriately and a lifting phenomenon may occur on the organic layer 55, especially on the pad electrode 60 at an end portion of the organic layer 55.

To address the foregoing problem, the counter electrode layer 64 is firmly coated in the pad region PA by forming the protrusion portion with the protrusion layer 61, as described above, such that the organic layer 55 under the counter electrode layer 64 is held and not lifted.

In this way, processes of manufacturing the organic light-emitting display apparatus 1 are simplified and, at the same time, an adhesive force between the pad electrode 60 and the organic layer 55 is improved, thus preventing a defect.

FIGS. 3A thru 3J are cross-sectional views schematically showing a method of manufacturing the organic light-emitting display apparatus shown in FIG. 2 according to an exemplary embodiment of the present invention.

Figure 3A:
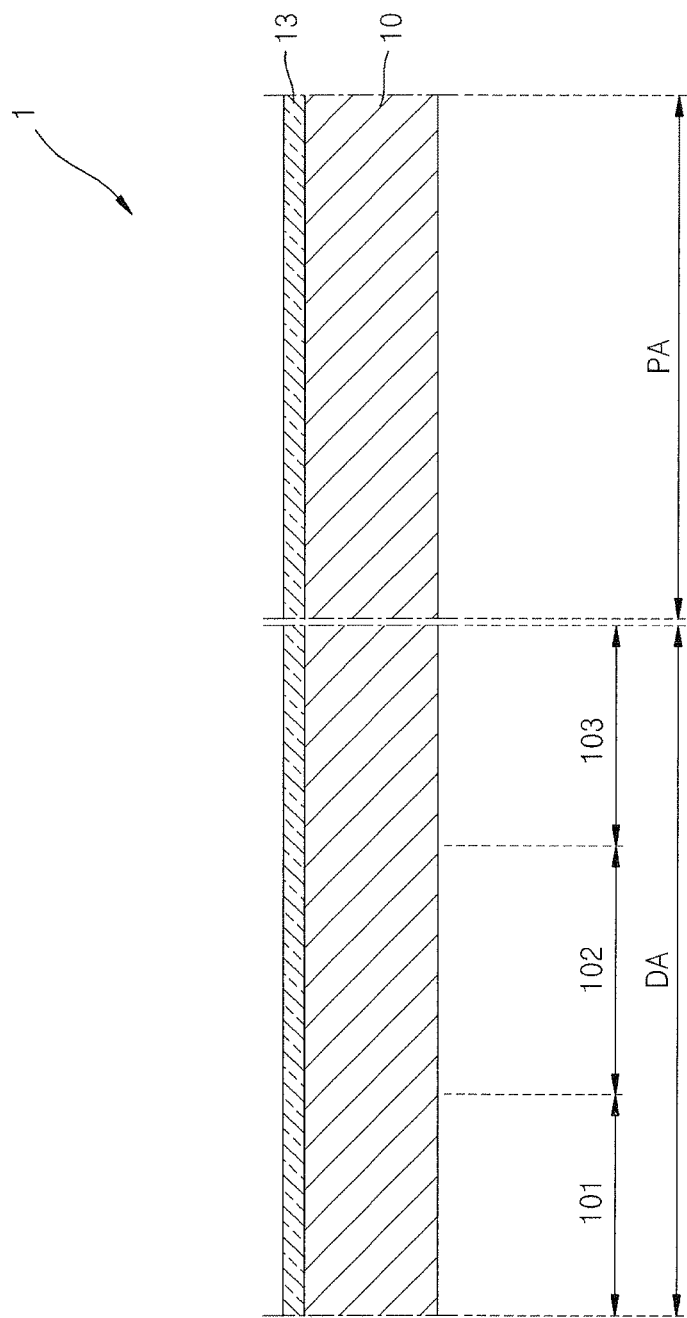
FIGS. 3A thru 3J are cross-sectional views schematically showing a method of manufacturing the organic light-emitting display apparatus shown in FIG. 2 according to an exemplary embodiment of the present invention.

As shown in FIG. 3A, the buffer layer 13 is formed on the first substrate 10. More specifically, the first substrate 10 may be formed of a transparent glass material having $SiO_2$ as its main component. However, the first substrate 10 may also be formed of various materials, such as a transparent plastic material or a metal material, without being limited to the transparent glass material.

The buffer layer 13 may be selectively formed on the first substrate 10 as to prevent impurity ions and moisture or external air from penetrating into the first substrate 10, and to planarize the surface of the first substrate 10. The buffer layer 13 may be deposited by various deposition methods, such as a plasma-enhanced chemical vapor deposition (PECVD) method, an atmospheric pressure CVD (APCVD) method, and a low-pressure CVD (LPCVD) method using $SiO_2$ and/or $SiN_x$.

Figure 3B:
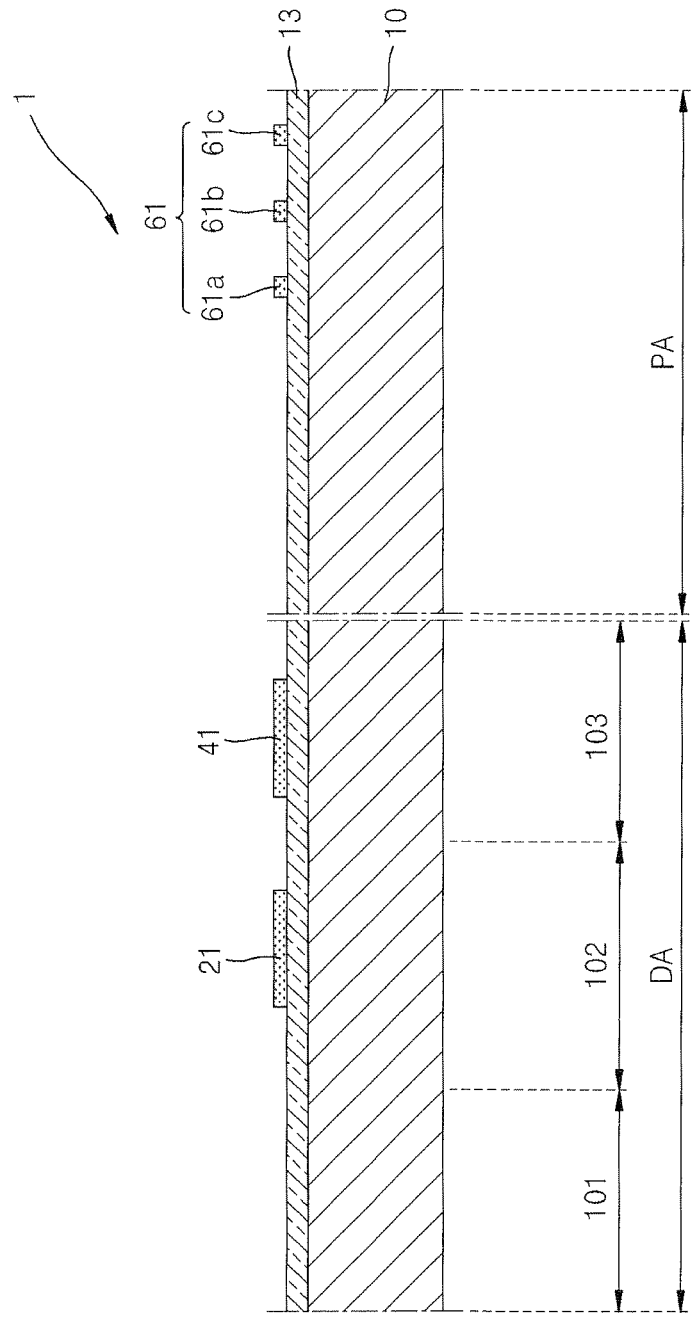

As shown in FIG. 3B, the active layer 21 of the TFT, the capacitor lower electrode 41 of the capacitor Cst, and the protrusion layer 61 of the pad region PA are formed on the buffer layer 13. More specifically, amorphous silicon is deposited on the buffer layer 13 and then crystallized, thus forming a polycrystalline silicon layer (not shown). The amorphous silicon may be crystallized by using various methods, such as a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method. As such, through a mask process using a first mask (not shown), the polycrystalline silicon layer is patterned into the active layer 21 of the TFT, the capacitor lower electrode 41 of the capacitor Cst, and the protrusion layer 61 of the pad region PA.

Figure 3C:
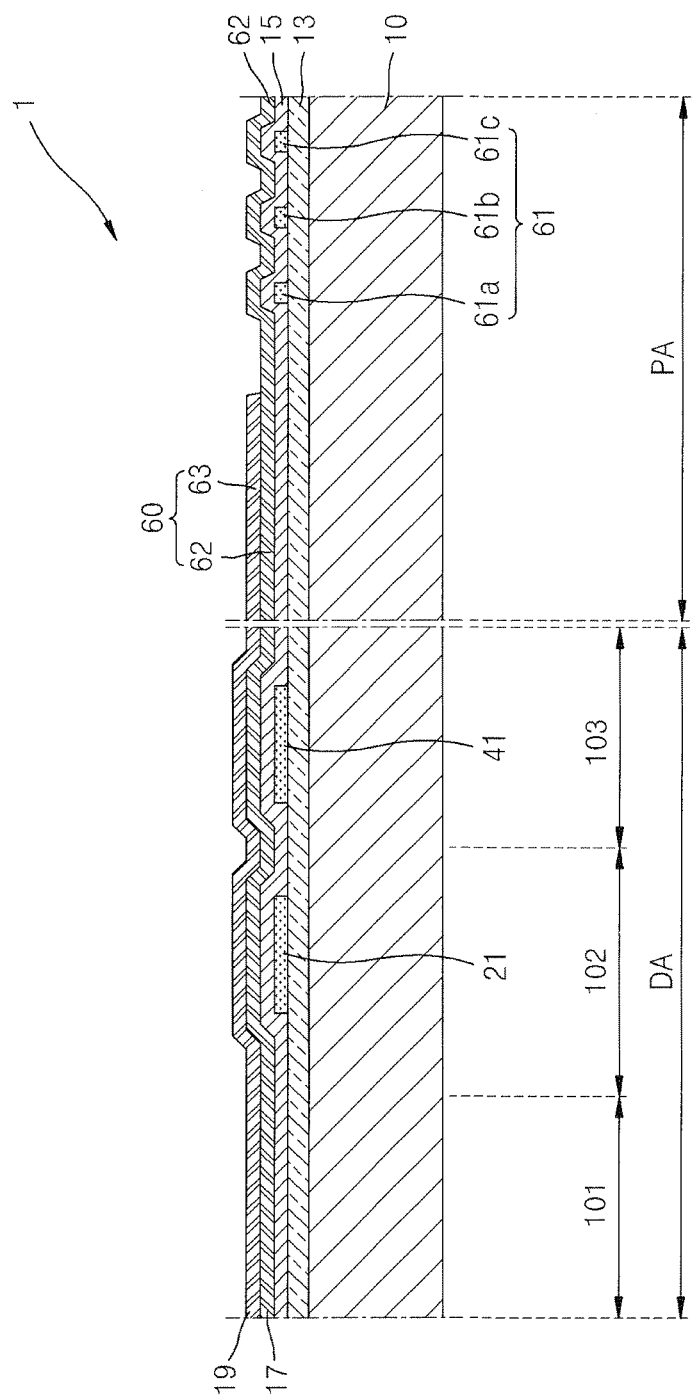

As shown in FIG. 3C, on the entire surface of the first substrate 10 where the active layer 21, the capacitor lower electrode 41 and the protrusion layer 61 are formed, the gate insulating layer 15, a first conductive layer 17 and a second conductive layer 19 are sequentially deposited.

The gate insulating layer 15 may be deposited as an inorganic insulating layer, such as $SiN_x$ or $SiO_x$, by using a PECVD method, an APCVD method, or an LPCVD method. The gate insulating layer 15 is interposed between the active layer 21 of the TFT and the gate electrode 20 (see FIG. 3D) so as to function as an insulating layer, and between the capacitor upper electrode 43 and the capacitor lower electrode 41 so as to function as a dielectric layer of the capacitor Cst. In the pad region PA, the protrusion layer 61 is covered along a protrusion outline.

The first conductive layer 17 may include one or more materials selected from among transparent materials, such as ITO, IZO, ZnO, and $In_2O_3$. The first conductive layer 17 later functions as the pixel electrode 31, the gate lower electrode 23, the capacitor upper electrode 43, and the pad lower electrode 62.

The second conductive layer 19 may include one or more materials selected from among Ag, Mg, Al, Pt, Pd, Au, Ni, Nd, Ir, Cr, Li, Ca, Mo, Ti, W, MoW, and Al/Cu. The second conductive layer 19 is later patterned into the gate upper electrode 25 and the pad upper electrode 63.

Figure 3D:
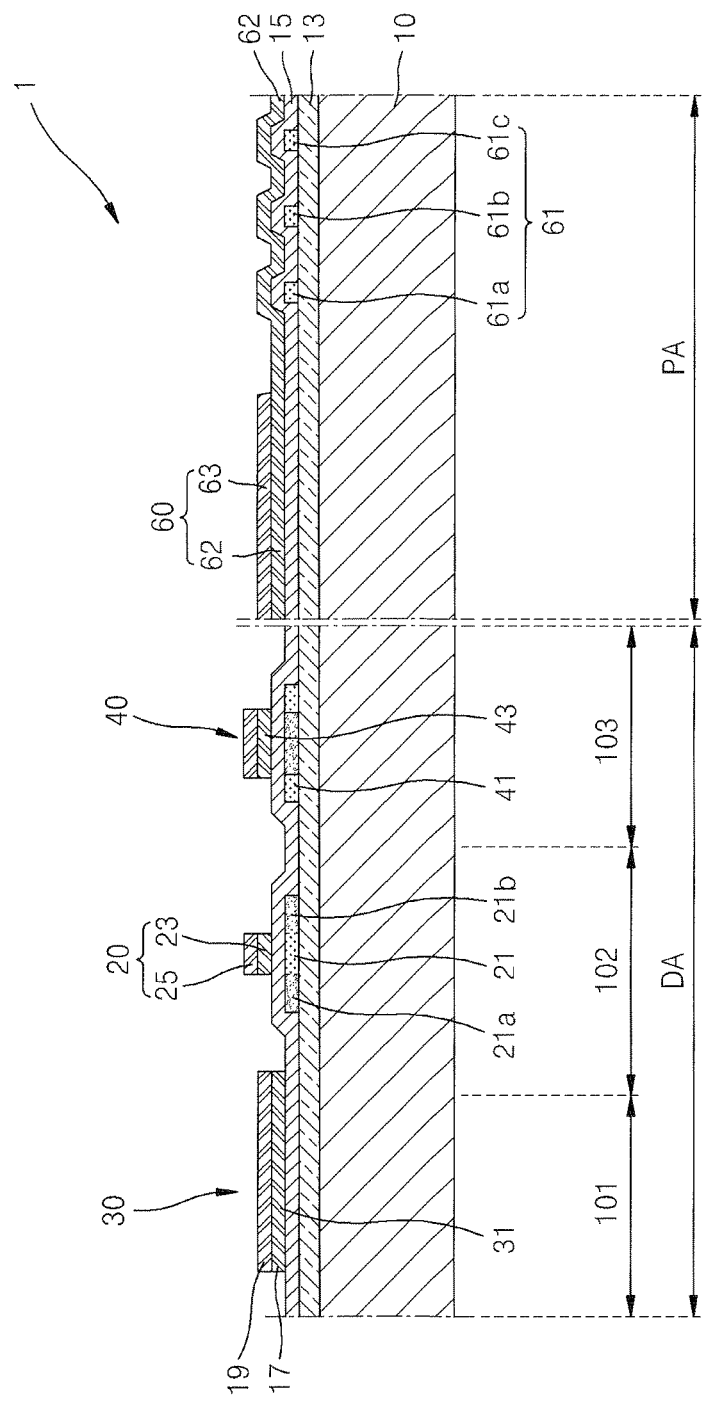

As further shown in FIG. 3D, an electrode pattern 30 for the pixel electrode 31, the gate electrode 20, an electrode pattern 40 for the capacitor upper electrode 43, and the pad electrode 60 are formed on the first substrate 10. To be more specific, the first conductive layer 17 and the second conductive layer 19 are patterned by a mask process using a second mask (not shown). In this state, in the channel region 102, the gate electrode 20 is formed on the active layer 21, the gate electrode 20 including the gate lower electrode 23 formed of a part of the first conductive layer 17 and the gate upper electrode 25 formed of a part of the second conductive layer 19.

The gate electrode 20 corresponds to a center of the active layer 21, and by using the gate electrode 20 as a mask, n-type or p-type impurities are injected into the active layer 21, thereby forming the source region 21a and the drain region 21b at both side end portions of the active layer 21 corresponding to both sides of the gate electrode 20, and forming a channel region between the source region 21a and the drain region 21b.

The electrode pattern 30 for forming the pixel electrode 31 is formed in the pixel region 101, and the electrode pattern 40 for forming the capacitor upper electrode 43 is formed on the capacitor lower electrode 41 in the storage region 103.

In the pad region PA, the pad electrode 60 is formed on the gate insulating layer 15. The pad electrode 60 includes the pad lower electrode 62 formed of a part of the first conductive layer 17 and the pad upper electrode 63 formed of a part of the second conductive layer 19. The pad lower electrode 62 forms the protrusion portion along a protrusion outline of the protrusion layer 61.

Figure 3E:
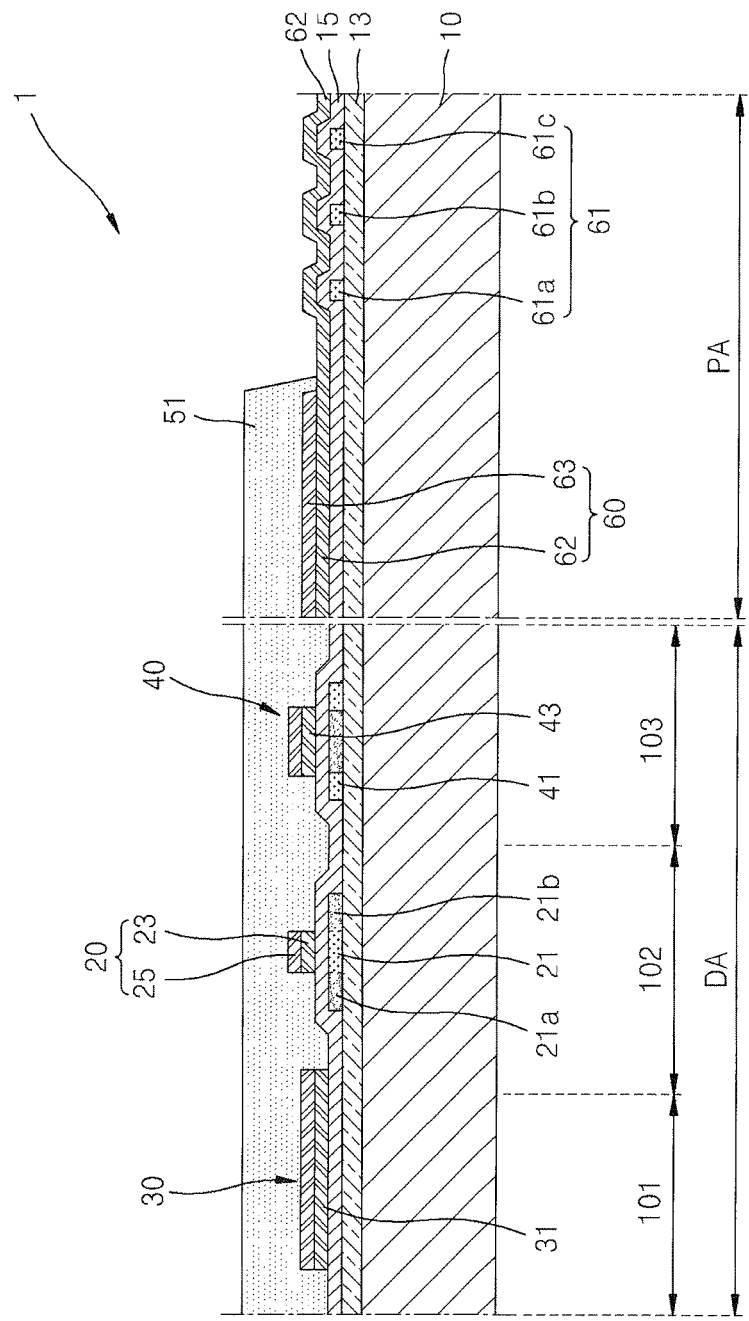

Next, as shown in FIG. 3E, the interlayer insulating layer 51 is deposited on the entire surface of the first substrate 10.

The interlayer insulating layer 51 is formed of one or more organic insulating layers selected from a group consisting of polyimide, polyamide, acrylic resin, benzocyclobutene, and phenol resin, by using spin coating or the like. The interlayer insulating layer 51 may also be formed of an inorganic insulating material, as well as an organic insulating material, and may also be formed by alternating the organic insulating material and the inorganic insulating material.

Figure 3F:
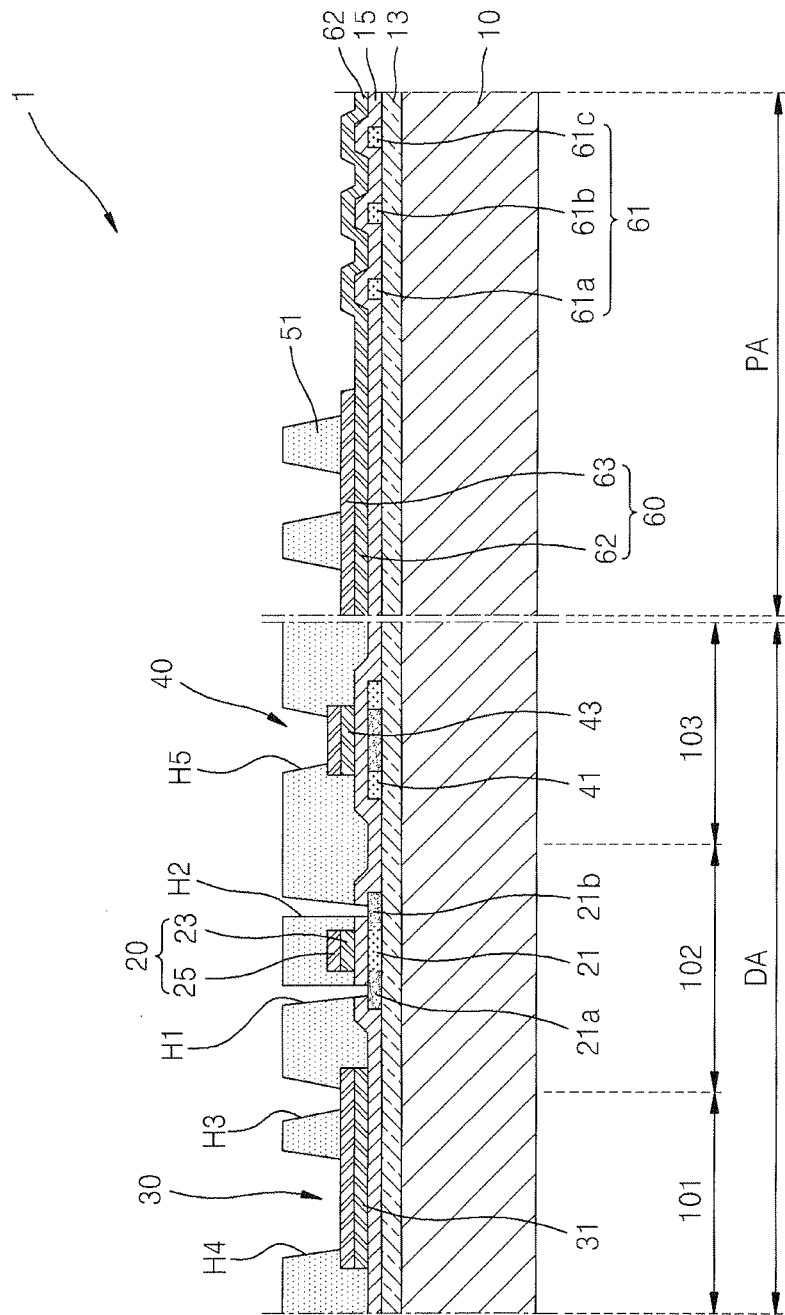

Next, as shown in FIG. 3F, in the interlayer insulating layer 51, openings H1, H2, H3, H4, and H5, which expose portions of the electrode patterns 30 and 40 and portions of the source region 21a and the drain region 21b, are formed. The openings H1, H2, H3, H4, and H5 are formed by patterning through a mask process using a third mask (not shown). In this state, the interlayer insulating layer 51 of the pad region PA is also patterned as shown in FIG. 3F.

Herein, the openings H1 and H2 expose portions of the source region 21a and the drain region 21b, the openings H3 and H4 expose a portion of the second conductive layer 19 forming an upper portion of the electrode pattern 30, and the opening H5 exposes a portion of the second conductive layer 19 forming an upper portion of the electrode pattern 40.

Figure 3G:
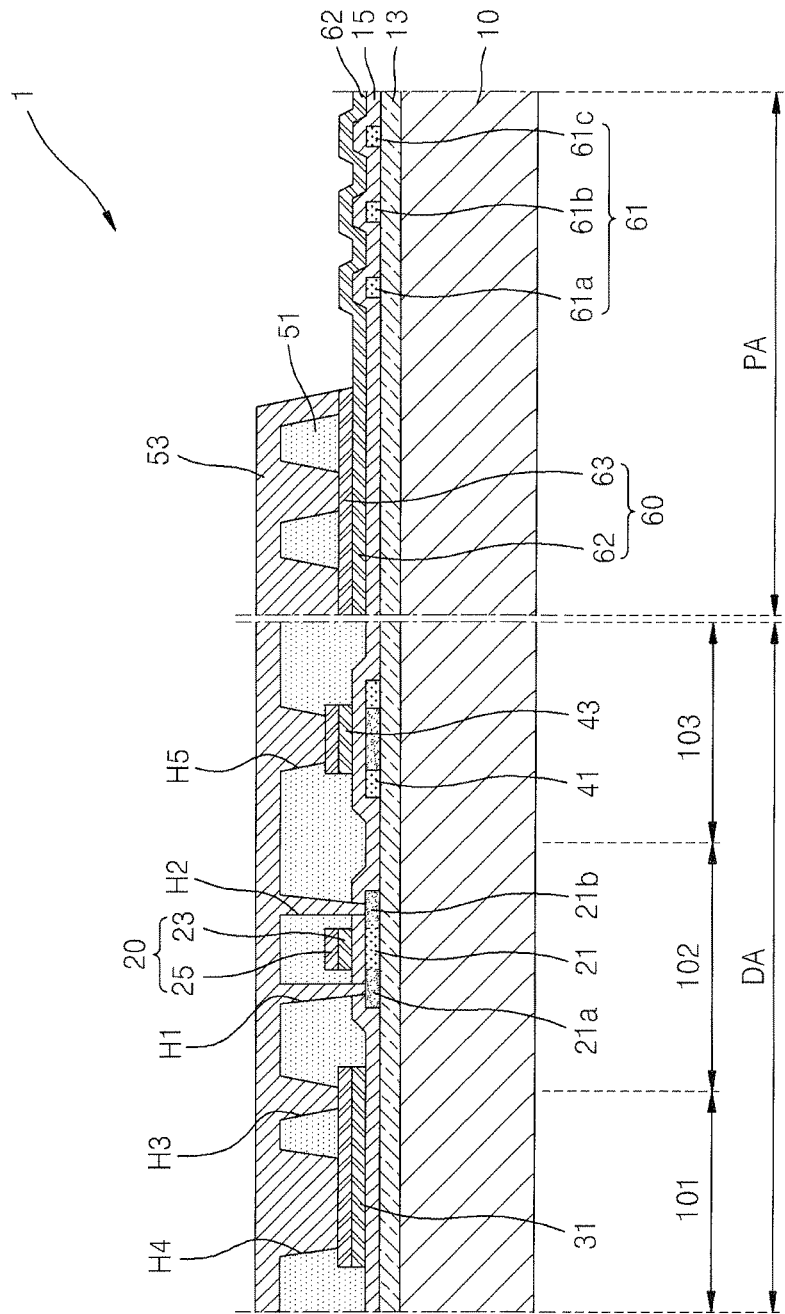

Next, as shown in FIG. 3G, a third conductive layer 53 is deposited on the entire surface of the first substrate 10 so as to cover the interlayer insulating layer 51.

The third conductive layer 53 may be formed of, but is not limited to, the conductive material forming the first conductive layer 17 or the second conductive layer 19, or other various conductive materials. The conductive material is deposited to a thickness sufficiently large to fill the openings H1, H2, H3, H4, and H5.

Figure 3H:
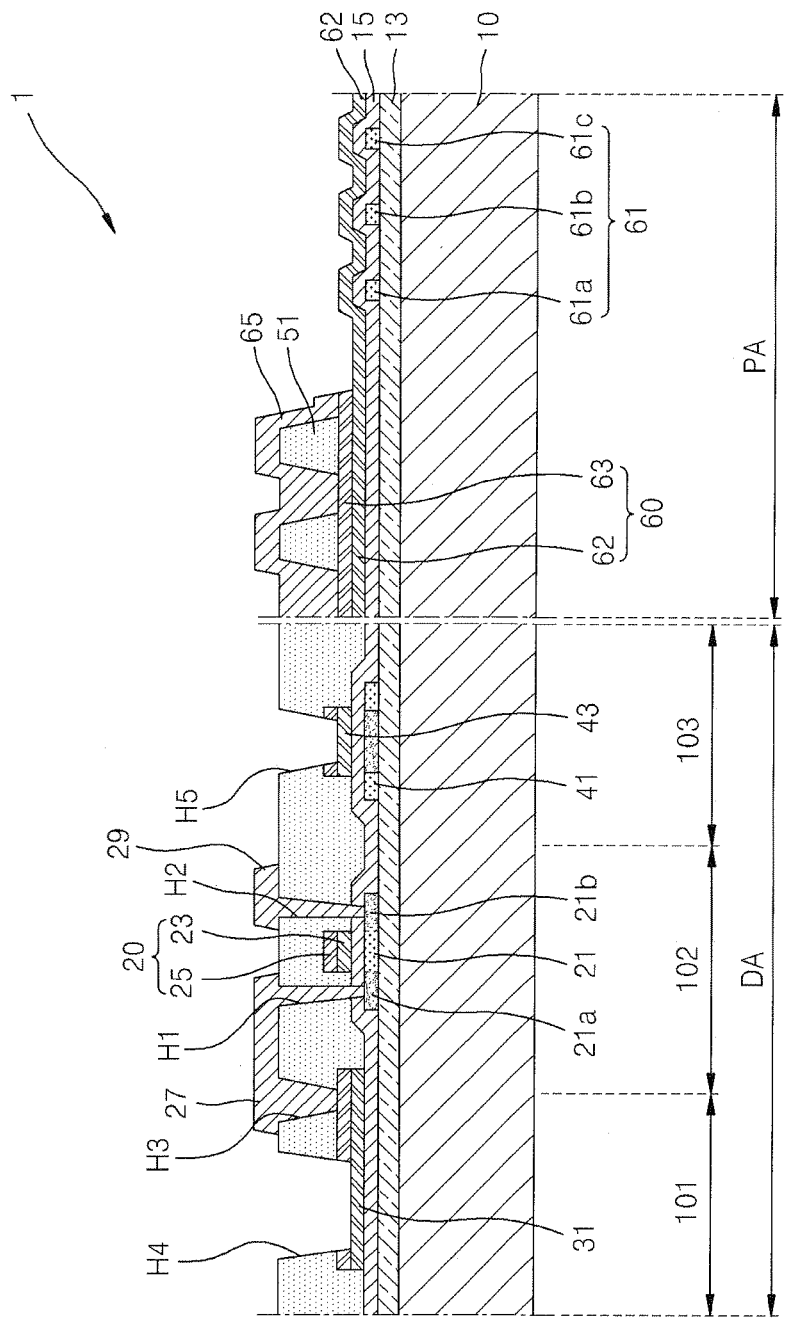

As shown in FIG. 3H, the source electrode 27, the drain electrode 29, the pixel electrode 31, the capacitor upper electrode 43, and the source/drain electrode layer 65 of the pad region PA are formed. More specifically, the third conductive layer 53 is patterned by a mask process using a fourth mask (not shown), thus forming the source electrode 27 and the drain electrode 29, and the source/drain electrode layer 65.

In this state, the source electrode 27 or the drain electrode 29 (the source electrode 27 in the current embodiment) is formed so as to be connected to the pixel electrode 31 through the opening H3 at an edge of the upper second conductive layer 19 of the electrode pattern 30 where the pixel electrode 31 is to be formed.

After the source electrode 27 and the drain electrode 29 are formed, the pixel electrode 31 and the capacitor upper electrode 43 are formed by additional etching. In other words, by removing the upper second conductive layer 19 exposed by the opening H4 from the electrode pattern 30, the pixel electrode 31 is formed. Then the upper second conductive layer 19, exposed by the opening H5, is removed from the electrode pattern 40, thus forming the capacitor upper electrode 43.

Therefore, the pixel electrode 31, the gate lower electrode 23, the capacitor upper electrode 43, and the pad lower electrode 62 are formed on the same layer, and the gate upper electrode 25 and the pad upper electrode 63 are formed on the same layer.

Figure 3I:
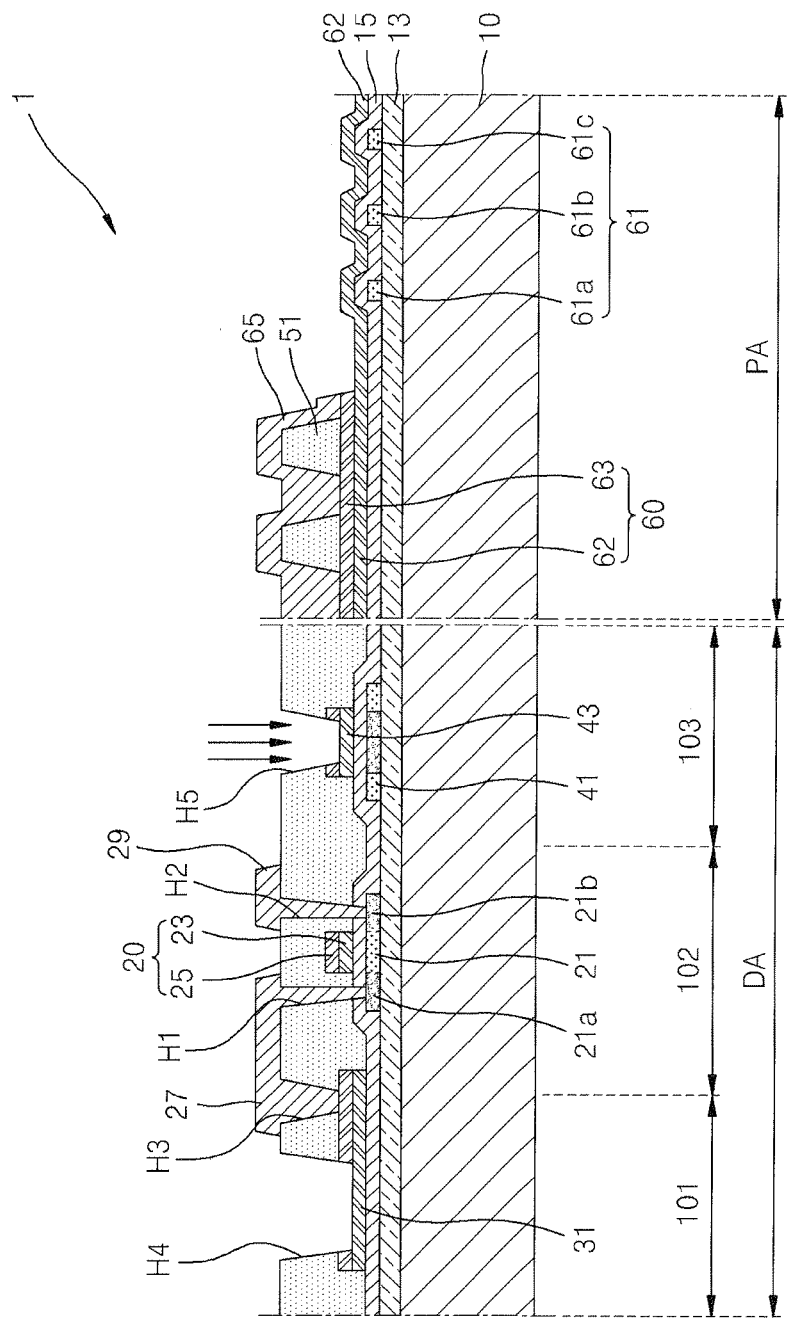

Next, as shown in FIG. 3I, n-type or p-type impurities are injected through the opening H5 as to dope the capacitor lower electrode 41.

Figure 3J:
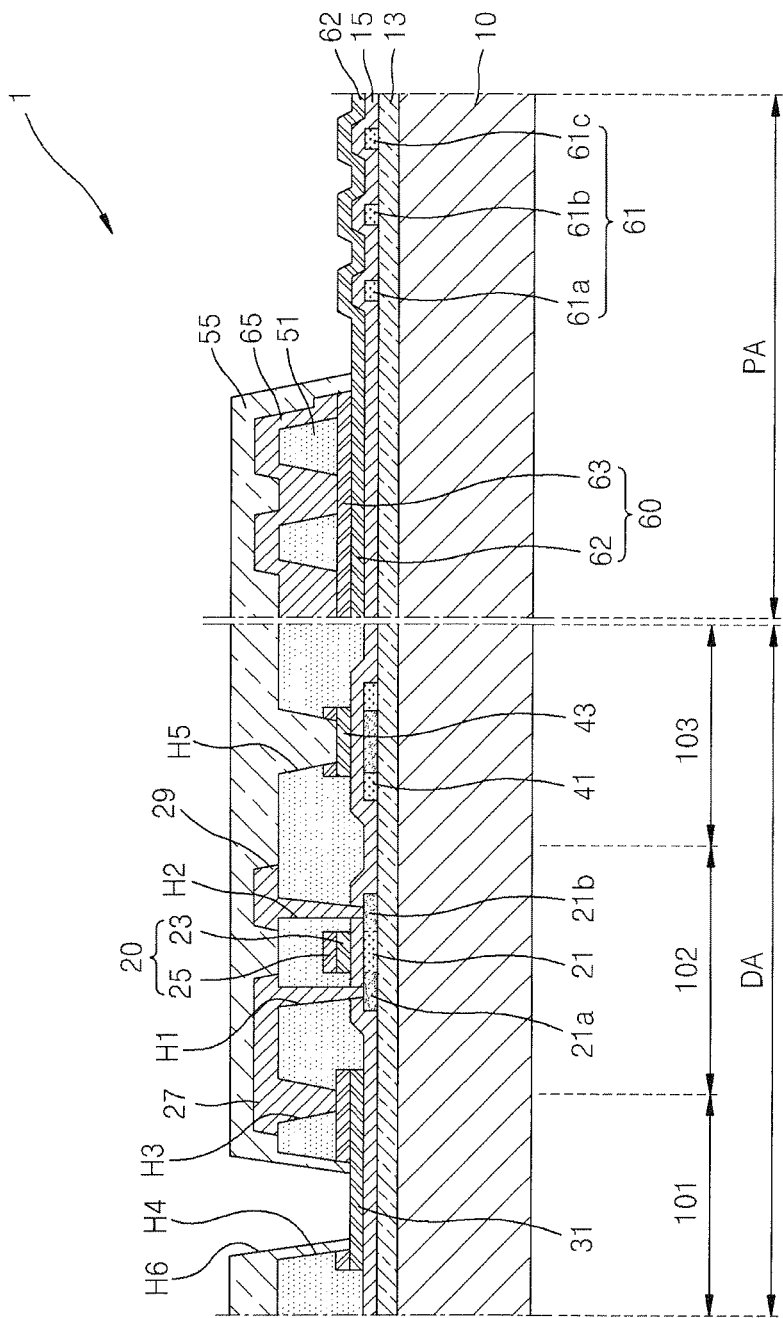

As shown in FIG. 3J, the organic layer 55 is formed on the first substrate 10 so as to function as a PDL. More specifically, the organic layer 55 is deposited on the entire surface of the first substrate 10 on which the pixel electrode 31, the source electrode 27, the drain electrode 29, the capacitor upper electrode 43, and the source/drain electrode layer 65 are formed.

The organic layer 55 may be formed of one or more organic insulating materials selected from a group consisting of polyimide, polyamide, acrylic resin, benzocyclobutene, and phenol resin, by using spin coating or the like.

The organic layer 55 is patterned by a mask process using a fifth mask (not shown) so as to form an opening H6 for exposing a central portion of the pixel electrode 31, thus defining a pixel.

Thereafter, as shown in FIG. 2, the light-emitting layer 33 is formed in the opening H6 of FIG. 3J, exposing the pixel electrode 31, and the counter electrode 35 is formed on the entire surface of the first substrate 10.

The light-emitting layer 33 includes an organic emissive layer (EML), and may further include one or more of a hole transport layer (HTL), a hole injection layer (HIL), an electron transport layer (ETL), and an electron injection layer (EIL).

The counter electrode 35 is deposited on the entire surface of the first substrate 10 so as to be formed as a common electrode. In the organic light-emitting display apparatus 1 according to the current embodiment of the present invention, the pixel electrode 31 is used as an anode electrode and the counter electrode 35 is used as a cathode electrode. Needless to say, however, polarities of the pixel electrode 31 and the counter electrode 35 are exchangeable. In the pad region PA, the counter electrode layer 64 is formed of the same layer as the counter electrode 35 along a protrusion outline of the protrusion layer 61, as described previously. In this case, the counter electrode layer 64 can be bonded to the pad lower electrode 62 on the protrusion layer 61 with a large contact area, thus firmly supporting the organic layer 55 formed under the counter electrode layer 64.

Figure 4:
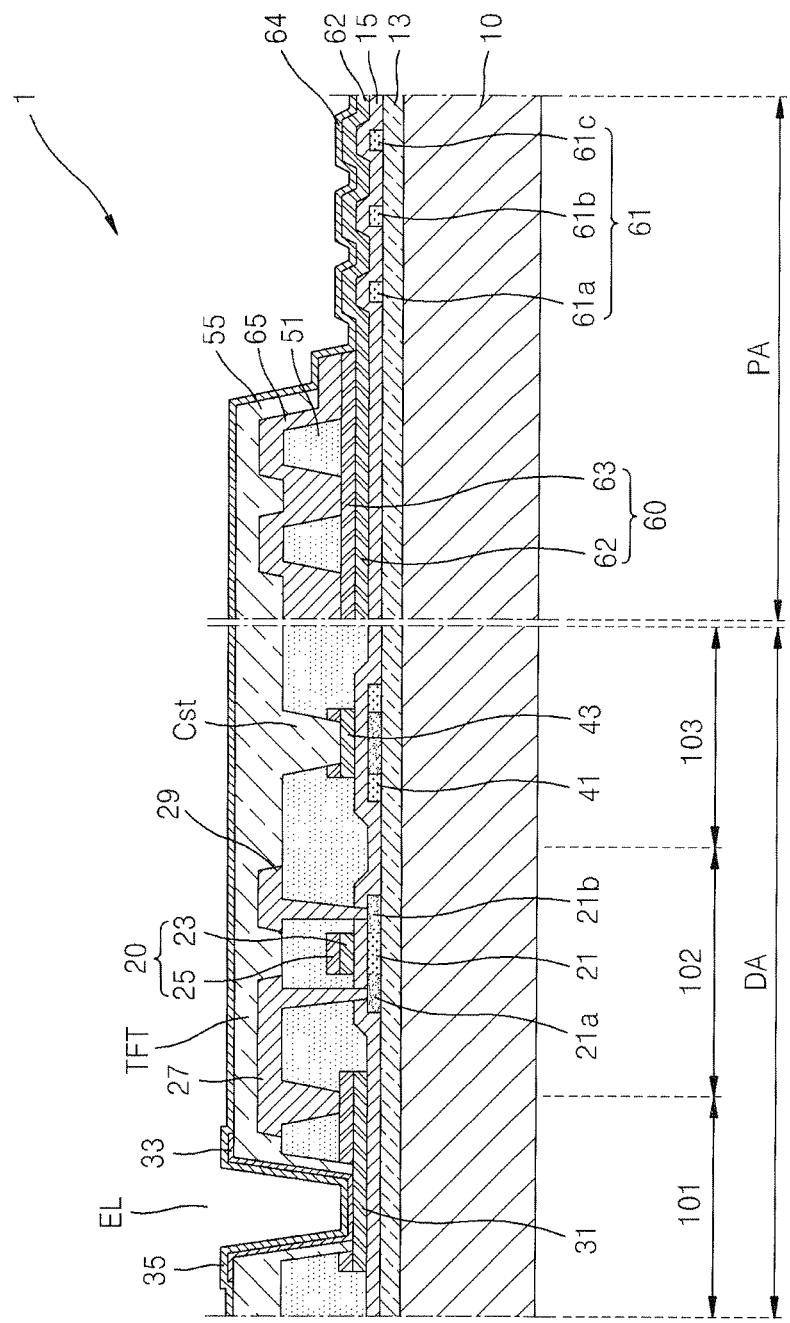
FIG. 4 is a plan view showing a modification of the organic light-emitting display apparatus shown in FIG. 2.

FIG. 4 is a plan view showing a modification of the organic light-emitting display apparatus shown in FIG. 2.

In the current embodiment, the organic layer 55 is formed so as to cover both the source/drain electrode layer 65 and the pad upper electrode 63 in the pad region PA. However the structure may be modified so that, as shown in FIG. 4, the organic layer 55 is formed so to expose portions of the source/drain electrode layer 65 and the pad upper electrode 63, and so that the counter electrode layer 64 contacts the exposed portions. In this case, the contact area of the counter electrode layer 64 increases, thus more strictly suppressing lifting of the organic layer 55.

As can be appreciated from the foregoing description, with the organic light-emitting display apparatus and the method of manufacturing the same according to an embodiment of the present invention, manufacturing can be completed using only five masks, thereby reducing cost and simplifying manufacturing processes with the reduction in the number of mask uses. In addition, a problem caused by an organic layer coating defect in the pad region can also be solved.

While the present invention has been particularly shown and described with reference to an exemplary embodiment thereof, this has been provided for the purposes of illustration, and it will be understood by those of ordinary skill in the art that various modifications and other equivalent embodiments can be made from the present invention. Accordingly, the true technical scope of the present invention should be defined by the technical spirit of the appended claims.

What is claimed is:

1. An organic light-emitting display apparatus, comprising:
   a light-emitting region including an organic light-emitting element, a thin-film transistor (TFT), and a capacitor; and
   a non-light-emitting region including a pad region connected to wiring of the light-emitting region, the pad region comprising:
      a protrusion layer including a plurality of protrusions formed on a substrate so as to protrude;
      a pad electrode including a pad lower electrode and a pad upper electrode, the pad lower electrode being arranged on the protrusions in a protrusion portion formed along a protrusion outline of the protrusion layer and a flat portion formed along the substrate, the pad upper electrode being formed on the flat portion of the pad lower electrode;
      a source/drain electrode layer formed on the pad upper electrode;
      an organic layer formed on the source/drain electrode layer, the protrusion portion being non-overlapped by the organic layer, the organic layer being an insulating layer that is at least 3 microns thick, the organic layer serving as a pixel defining layer by exposing a pixel electrode of the organic light emitting element; and
      a counter electrode layer formed directly on the pad lower electrode within the protrusion portion and on the organic layer within the flat portion of the pad region, the counter electrode being in direct contact with the pad lower electrode in each of the tops, bottoms and sidewalls of each of the protrusions to prevent the organic layer from delaminating by increasing a contact area between the counter electrode and the pad lower electrode.

2. The organic light-emitting display apparatus of claim 1, further comprising a buffer layer formed between the substrate and the protrusion layer.

3. The organic light-emitting display apparatus of claim 1, further comprising a gate insulating layer formed between the protrusion layer and the pad lower electrode, and an interlayer insulating layer formed between the pad upper electrode and the source/drain electrode layer.

4. The organic light-emitting display apparatus of claim 1, wherein the organic layer is formed so as to cover both the source/drain electrode layer and the pad upper electrode.

5. The organic light-emitting display apparatus of claim 1, wherein the organic layer is formed so as to expose portions of the source/drain electrode layer and the pad upper electrode, and the counter electrode layer is formed so as to contact the exposed portions of the source/drain electrode layer and the pad upper electrode.

6. The organic light-emitting display apparatus of claim 1, wherein the TFT comprises an active layer formed on a same layer as the protrusion layer, a gate electrode formed on a same layer as the pad electrode, and source/drain electrodes formed of a same layer as the source/drain electrode layer.

7. The organic light-emitting display apparatus of claim 1, wherein the organic light-emitting element comprises a pixel electrode formed on a same layer as the pad electrode, a counter electrode formed of a same layer as the counter electrode layer, and a light-emitting layer interposed between the pixel electrode and the counter electrode.

8. The organic light-emitting display apparatus of claim 1, wherein the capacitor comprises a capacitor lower electrode formed on a same layer as the protrusion layer, a capacitor upper electrode formed on a same layer as the pad lower electrode and the pixel electrode, and a gate insulating layer interposed between the capacitor lower electrode and the capacitor upper electrode.

9. The organic light-emitting display apparatus of claim 1, the flat portion of the pad region is interposed between the protrusion portion of the pad region and the light emitting region.

10. The organic light-emitting display apparatus of claim 1, the protrusion portion to prevent delamination of the organic layer by providing for an increased contact area between the counter electrode and the pad lower electrode.

11. The organic light-emitting display apparatus of claim 1, wherein the organic layer is comprised of a material selected from a group consisting of polyimide, polyamide, acrylic resin, benzocyclobutene and phenol resin.

12. An organic light emitting display apparatus, comprising:
   a substrate extending across a light emitting region and a pad region, the pad region including a flat portion and a protrusion portion;
   a polycrystalline silicon layer arranged on the substrate and serving as an active layer for a thin film transistor and a lower electrode of a capacitor in the light emitting region and serving as a plurality of protrusions in the protrusion portion;
   a first insulating layer arranged on the polycrystalline silicon layer;
   a first metallic layer arranged on the first insulating layer and serving as a pixel electrode of an organic light emitting element, as a capacitor upper electrode in the light emitting region and as a lower pad electrode in the pad region;
   an interlayer insulating layer arranged on the first metallic layer and having openings exposing the active layer, the pixel electrode and the capacitor upper electrode, the interlayer insulating layer being arranged also within the flat portion of the pad region;
   a source/drain metallic layer arranged on the interlayer insulating layer in both the light emitting region and in the flat portion of the pad region to connect to the pixel electrode and the active layer;
   an organic insulating layer arranged on the source/drain metallic layer in the light emitting region and the flat portion of the pad region, the organic insulating layer serving as a pixel defining layer by having an opening exposing the pixel electrode, the organic insulating layer being at least 3 microns thick;
   a light emitting layer arranged within the opening of the organic insulating layer; and
   a counter electrode arranged on the light emitting layer and on the organic insulating layer in the light emitting region and in the flat portion of the pad region, the counter electrode being in direct contact with the first metallic layer in the protrusion portion of the pad region.

13. The organic light-emitting display apparatus of claim 12, the organic insulating layer being absent from the protrusion portion of the pad region, the organic insulating layer being comprised of a material selected from a group consisting of polyimide, polyamide, acrylic resin, benzocyclobutene and phenol resin.

14. The organic light-emitting display apparatus of claim 12, the polycrystalline silicon protrusions within the protrusion portion of the pad region provides for an increased contact area between the counter electrode and the first metallic layer.

15. The organic light-emitting display apparatus of claim 12, the first metallic layer including a lower layer and an upper layer, the upper layer being absent from the protrusion portion of the pad region.

16. The organic light-emitting display apparatus of claim 15, the polycrystalline silicon protrusions within the protrusion portion of the pad region provides for an increased contact area between the counter electrode and the lower layer of the first metallic layer, the counter electrode being in direct contact with the lower layer of the first metallic layer at the tops, bottoms and sidewalls of each of the protrusions in the protrusion portion of the pad region.

17. The organic light-emitting display apparatus of claim 12, wherein the protrusions prevent delamination of the organic insulating layer by enhancing an adhesive force between the first metallic layer and the counter electrode by providing a greater contact area between the first metallic layer and the counter electrode.

18. The organic light-emitting display apparatus of claim 12, wherein the organic insulating layer electrically insulates the counter electrode from the source/drain metallic layer.

19. The organic light-emitting display apparatus of claim 12, wherein the counter electrode is electrically connected to the source/drain metallic layer at an edge of the organic insulating layer at a boundary between the flat portion and the protrusion portion of the pad region.

20. The organic light-emitting display apparatus of claim 1, the organic layer being perforated by an opening in the light emitting region to expose the pixel electrode, wherein a light emitting layer is arranged within said opening while being interposed between the counter electrode and the pixel electrode.

* * * * *